United States Patent
Juland et al.

(10) Patent No.: US 11,056,354 B2
(45) Date of Patent: Jul. 6, 2021

(54) SEMICONDUCTOR SEPARATION DEVICE

(71) Applicant: Lumentum Technology UK Limited, Towcester (GB)

(72) Inventors: Ian David Juland, Long Buckby (GB); Douglas Ritchie, Towcester (GB); Graeme Harris, Towcester (GB)

(73) Assignee: Lumentum Technology UK Limited, Northamptonshire (GB)

(*) Notice: Subject to any disclaimer, the term of this patent is extended or adjusted under 35 U.S.C. 154(b) by 0 days.

(21) Appl. No.: 16/450,647

(22) Filed: Jun. 24, 2019

(65) Prior Publication Data
US 2019/0393052 A1 Dec. 26, 2019

(30) Foreign Application Priority Data
Jun. 25, 2018 (GB) .................................. 1810373

(51) Int. Cl.
| | |
|---|---|
| *H01L 23/31* | (2006.01) |
| *H01L 25/04* | (2014.01) |
| *H01L 25/065* | (2006.01) |
| *H01L 25/07* | (2006.01) |
| *H01L 25/11* | (2006.01) |
| *H01L 21/56* | (2006.01) |
| *H01L 21/32* | (2006.01) |
| *H01L 21/78* | (2006.01) |
| *H01L 25/075* | (2006.01) |

(52) U.S. Cl.
CPC ............ *H01L 21/561* (2013.01); *H01L 21/32* (2013.01); *H01L 23/3157* (2013.01); *H01L 21/78* (2013.01); *H01L 25/043* (2013.01); *H01L 25/0652* (2013.01); *H01L 25/0657* (2013.01); *H01L 25/071* (2013.01); *H01L 25/074* (2013.01); *H01L 25/0756* (2013.01); *H01L 25/112* (2013.01); *H01L 25/117* (2013.01)

(58) Field of Classification Search
CPC .............. H01L 23/3157; H01L 25/043; H01L 25/0657; H01L 25/074; H01L 25/0756; H01L 25/117; H01L 25/0652; H01L 25/071; H01L 25/112
See application file for complete search history.

(56) References Cited

U.S. PATENT DOCUMENTS

| | | | |
|---|---|---|---|
| 5,848,083 A * | 12/1998 | Haden | .................. H01L 25/112 372/36 |
| 7,208,343 B2 * | 4/2007 | Song | .................. H01L 25/0657 257/E25.013 |

(Continued)

FOREIGN PATENT DOCUMENTS

EP        0586888 A2 *  3/1994  ......... H01L 23/4985

*Primary Examiner* — Ida M Soward
(74) *Attorney, Agent, or Firm* — Harrity & Harrity, LLP

(57) ABSTRACT

Described is a semiconductor substrate stack, including: a plurality of semiconductor substrates arranged in a stack in which the semiconductor substrates include opposing facing surfaces, wherein the facing surfaces of adjacent semiconductor substrates are separated by a gap, each semiconductor substrate having an edge surface at an exposed edge of the stack. A spacer is attached to one of the facing surfaces of each of the at least one of the semiconductor substrates and extends between adjacent semiconductor substrates to define the gap and mask a central portion of each respective semiconductor substrate.

20 Claims, 3 Drawing Sheets

(56) References Cited

U.S. PATENT DOCUMENTS

| | | | | |
|---|---|---|---|---|
| 7,777,349 B2* | 8/2010 | Murayama | H01L 24/82 | 257/777 |
| 7,824,933 B2* | 11/2010 | Galland | H01L 22/14 | 438/17 |
| 7,973,310 B2* | 7/2011 | Wang | H01L 25/50 | 257/48 |
| 9,153,566 B1* | 10/2015 | Sato | H01L 25/074 | |
| 9,349,670 B2* | 5/2016 | Zhou | H01L 21/568 | |
| 9,452,407 B2* | 9/2016 | Tonkovich | F28F 3/048 | |
| 10,325,881 B2* | 6/2019 | Upadhyayula | H01L 24/16 | |
| 2002/0045290 A1* | 4/2002 | Ball | H01L 25/0657 | 438/106 |
| 2007/0025079 A1* | 2/2007 | Salmon | H01L 23/3171 | 361/688 |
| 2008/0315434 A1* | 12/2008 | McElrea | H01L 21/6835 | 257/777 |
| 2010/0001398 A1* | 1/2010 | Sah | H05K 1/141 | 257/723 |
| 2010/0140753 A1* | 6/2010 | Hembree | H01L 24/85 | 257/621 |
| 2014/0015598 A1* | 1/2014 | Groothuis | H01L 23/3135 | 327/524 |
| 2015/0130035 A1* | 5/2015 | Leow | H01L 25/0657 | 257/666 |
| 2015/0279431 A1* | 10/2015 | Li | H01L 25/0652 | 365/51 |
| 2015/0279828 A1* | 10/2015 | Koopmans | H01L 25/0652 | 257/713 |
| 2015/0303176 A1* | 10/2015 | Seng | H01L 25/0657 | 257/777 |
| 2015/0325543 A1* | 11/2015 | Katkar | H01L 24/98 | 257/738 |
| 2015/0332753 A1* | 11/2015 | Best | G11C 5/025 | 365/189.011 |
| 2017/0162545 A1* | 6/2017 | Park | H01L 25/50 | |
| 2018/0040592 A1* | 2/2018 | Gandhi | H01L 23/49827 | |
| 2018/0047706 A1* | 2/2018 | Upadhyayula | H01L 23/49816 | |

* cited by examiner

SEMICONDUCTOR SEPARATION DEVICE

RELATED APPLICATION

This application claims priority under 35 U.S.C. § 119 to United Kingdom Patent Application No. 1810373.9 filed on Jun. 25, 2018, the content of which is incorporated by reference herein in its entirety.

TECHNICAL FIELD

This invention relates to a semiconductor separation device and method for providing a stack of semiconductor substrates using the semiconductor separation device. In particular, the invention provides one or more semiconductor separation devices in the form of spacers located on the surface of a substrate which can be used to separate adjacent substrates.

BACKGROUND

Some semiconductor devices require the deposition of material to an edge surface. Such a deposition may be achieved using known techniques such as evaporation or sputtering in which the device is loaded into the appropriate apparatus and the material deposited. The present invention seeks to provide an improved edge deposition process.

SUMMARY

The present invention provides a semiconductor substrate stack, a semiconductor device substrate, and a method for coating the edge of a semiconductor substrate according to the appended claims.

Disclosed herein is a semiconductor substrate stack. The semiconductor substrate stack, comprises: a plurality of semiconductor substrates arranged in a stack in which opposing facing surfaces of adjacent semiconductor substrates are separated by a gap, each semiconductor substrate having an edge surface at an exposed edge of the stack. A spacer may be attached to one of the facing surface of each of the plurality of the semiconductor substrates and extending between adjacent semiconductor substrates to define the gap and mask a central portion of each respective semiconductor substrate.

Providing a spacer between adjacent substrates allows the processing of multiple substrates in a single stack. Such processing may include the deposition of a material on the exposed edge surface.

The spacer may be fixedly attached. Providing a fixedly attached spacer allows a more convenient way of stacking the substrates. Further, a fixedly attached spacer can also provide a mask for shielding a central portion of the substrate, and any devices located thereon, from subsequent processes steps which may include deposition of material on an exposed edge surface.

The substrates may be portions of a full semiconductor wafer and may include two or more dies. Each substrate may include a device surface on which the one or more devices are fabricated; an opposing back surface and one or more exposed edge surfaces which define the edge of the substrate and which extends between the device surface and opposing back surface. The device surface and back surface may be referred to as an upper surface and an under surface, or vice versa. The spacer may be fixedly attached to the device surface but may be alternatively or additionally be attached to the opposing back surface. The spacer may include a contacting surface which is attached to the substrate, and an opposing abutment surface which abuts a corresponding surface of an adjacent substrate.

The spacer may be separated from the exposed edge. Thus, the spacer may be placed at a distance from the exposed edge to provide a strip of semiconductor facing surface between the spacer and exposed edge.

The spacer may be bonded to one of the facing surfaces of each semiconductor substrate. The bonding may be achieved directly between the substrate and spacer. Alternatively, the substrate may include one or more intermediate layers which aids bonding.

The spacer may be a photoresist. The spacer may be a negative tone photoresist. The spacer may be an epoxy resin. The spacer may be SU-8.

The spacer may have a thickness greater than 5 microns. The spacer may have a thickness less than 100 microns The exposed edge and either or both of the device surface and an opposing surface of each semiconductor substrate may include a coating. The coating may cover at least a portion, for example, of the facing surface adjacent the exposed edge, or the spacer. The coating may be continuous across all of the exposed edge, spacer and either or both of the device surface and an opposing surface of each semiconductor substrate. The spacer may be referred to as a wall structure of the substrate. The wall structure may partition one or more surfaces of the substrate.

The coating may be anti-reflective. In some example, the coating may be reflective.

Further described is a semiconductor substrate having a plurality of dies arranged across a surface semiconductor substrate. Each of the plurality of dies may be defined by a die line. Each die may comprise at least one semiconductor device and a spacer.

The spacers may traverse the die line. Each substrate may have a plurality of spacers distributed across the surface thereof. The spacer may comprise a plurality of spacer pads. The plurality of spacers and/or spacer pads may have a common height.

Each spacer may include an elongate body having a longitudinal axis. The elongate body may be separated from the exposed edge along the length of the spacer. The separation may be substantially uniform along the length of the spacer so as to provide an exposed strip of substrate along the exposed edge.

Each spacer may be attached to at least one die. The spacer may extend across a plurality of semiconductor dies. Each spacer may be separated from an adjacent spacer on all sides. Each die may have an individual spacer contained within the boundary of the die. Each die may have a plurality of spacers.

Further described is a semiconductor device comprising: a substrate comprising at least one semiconductor device. An edge region of the substrate may include at least one layer of deposited material, the deposited material bounded by a wall structure. The wall structure may be provided by the spacer as described herein and having any of the features of the described features, either alone or in combination.

The semiconductor device may comprise a packaging in which the substrate is housed for use.

The edge region may include an exposed edge and/or a facing surface of the substrate.

Further described is a method of coating an exposed edge of a semiconductor die, comprising: fabricating at least one semiconductor device on a central portion of a semiconductor substrate; locating at least one spacer on at least one die; stacking the individual dies to provide a stack of dies in which facing surfaces of at least two adjacent semiconductor dies are separated by a gap, each semiconductor die having an edge surface arranged at an exposed edge of the stack, wherein the spacer defines the gap and masks the central portion; depositing a material on the exposed edge.

The deposition of the material on the exposed edge may be achieved via evaporating or sputtering.

The method may further comprise: separating the stack after the deposition of the material and packaging each die within a device package without removing the spacer. The method may further comprise cutting the substrate to provide a plurality of dies.

The skilled person will appreciate that except where mutually exclusive, a feature described in relation to any one of the above aspects may be applied mutatis mutandis to any other aspect. Furthermore except where mutually exclusive any feature described herein may be applied to any aspect and/or combined with any other feature described herein.

BRIEF DESCRIPTION OF THE DRAWINGS

Examples of semiconductor substrates, corresponding substrate stacks and an associated fabrication process will now be described with reference to the Figures, in which.

DETAILED DESCRIPTION

Figure 1:
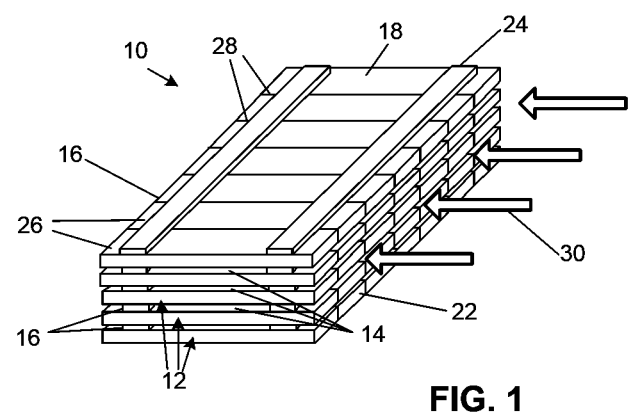
FIG. 1 shows a semiconductor substrate stack having a plurality of semiconductor substrates which are separated by a spacer.
Figure 2:
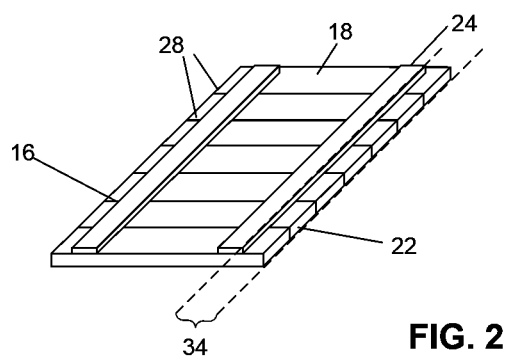
FIG. 2 shows a single layer of the stack of FIG. 1.

FIG. 1 shows a schematic representation of a semiconductor substrate stack 10 which comprises: a plurality of semiconductor substrates 12 arranged in a stack 10 in which the facing surfaces of adjacent semiconductor substrates 12 are separated by a gap 14. Each semiconductor substrate 12 has an edge surface 22 arranged at an exposed edge of the stack 10. A spacer 16 is provided on a surface of a plurality of the semiconductor substrates 12. The spacer 16 defines the gap 14 and may mask a central portion of each respective semiconductor substrate 12. It will be appreciated that the uppermost layer of the stack has been removed in the representation of FIG. 1 to show the spacers 16 more clearly. It will also be appreciated that the representations provided by the drawings are schematic and the respective parts not necessarily correctly scaled in relation to one another.

Each spacer 16 may be fixedly attached to a surface 18 of the substrate 12. Thus, the spacer 16 is attached to the surface 18 and will not become separated during normal handling of the substrate 12, or a die taken from the substrate 12, and will be resistant to subsequent processing steps. To provide the attachment, the spacer 16 may be adhered to the surface 18 by virtue of a bond formed between the spacer 16 and surface 18.

In some examples, the spacer 16 may be a surface feature of the substrate 12 and/or integrally formed with the substrate 12. The material of the spacer 16 and semiconductor substrate 12 may have suitable properties to allow for direct bonding. Alternatively or additionally, one or more intermediate layers or coatings may be provided on the semiconductor substrate prior to the application of the spacer.

The stack 10 shown in FIG. 1 includes a plurality of stacked substrates 12, with a separate substrate 12 in each layer of the stack 10. The substrates 12 may have predetermined die lines 28 which define each of a plurality of dies. The die lines 28 may be marked on the substrates 12 in some way or may simply be accounted for in the layout of the devices which are fabricated on the dies. In the case of the latter, the die lines may be defined by virtual/imaginary die lines. The die lines 28 define the cleave line along which the substrate is diced to provide the individual dies 26. The dicing is typically carried out after the stack has been disassembled but this may not be the case. Hence, individual layers of the stack may include single sheets of semiconductor substrates 26 or individual substrate portions or dies 12.

Each die 12 may include a spacer surface 18 on which the spacer 16 is provided. The spacer surface 18 may be a device surface on which one or more devices (not shown) are fabricated. Each die will also include an opposing back surface which is obscured from view in the Figures. The spacer surface 18 and opposing back surface provide the planar major surfaces of the substrate 12 and are separated by the thickness of the substrate 12. The periphery of the substrates are provided with one or more exposed edges surfaces 22 which extend between the device surface 18 and opposing back surface 20. The device surface and opposing back surfaces may be referred to the planar or facing surfaces of the substrate. Further, the spacer surface and/or device surface and opposing back surface may be referred to as an upper surface or an under surface, or vice versa.

Each spacer 16 includes a contacting surface which is attached to the spacer surface 18 of the substrate 12, and an opposing abutment surface 24 which abuts a corresponding opposing surface of an adjacent substrate 12. Thus, the spacers 16 are sandwiched between opposing surfaces of adjacent substrates 12 and separate the adjacent substrates 12 by the thickness of the spacers 16.

Each spacer 16 extends across a surface of the respective substrate 12 and has a contacting surface area, x,y, and thickness, z, in accordance with the directions shown in FIG. 1. The dimensions of the contacting surface area will be sufficient to provide the necessary adherence and structural integrity required for the spacer 16 to withstand subsequent processing steps without becoming separated from the substrate 12. Subsequent processing steps may include subsequent fabrication steps or one or more edge deposition processes, for example. The general dimensions of the spacers 16 should also be sufficient to withstand any compressive force applied when the stack is assembled. This will of course be dependent on the material used for the spacers 16 and the compressive force applied, amongst other variables which will be apparent to the skilled person.

The thickness of the spacers 16 will determine the separation of the layers of the stack 10. In some examples, the contacting surface and the abutment surface 24 of the spacer will be uniformly spaced, i.e. the spacer 16 may have uniform thickness. Providing a uniform thickness (within ordinary tolerances) helps achieve a uniform abutment across the surface of the opposing dies or substrates which may improve the masking function of the spacers. Generally, the thickness of the spacer will be less than the width or length of the spacer.

The spacers may have a thickness between 5 microns and 100 microns. The separation from the exposed edge of the substrate may be up to 100 microns. The spacers may be flush with (or potentially overhang) the edge of the exposed edge. The lateral dimensions of the spacers in the x direction extending in from the exposed edge may be between 20 microns and 200 microns. The length of the spacer in the y direction extending parallel to the exposed edge may extend the full length of the substrate or a die portion thereof, as described. The full length may be between 13 mm and 17 mm.

For segmented spacers comprising a plurality of spacer pads, the y-dimension may extend between 0.25 mm to 9 mm, for example.

In the example shown in FIG. 1, there is a plurality of spacers distributed across the surface of the substrate 12 to allow the substrate to be supported properly. In the example of FIG. 1, there are two spacers 16 which are positioned local to the exposed edges on opposing sides of the substrate. The separation of each spacer 16 may be equidistant from the respective exposed edge 22. It will be appreciated that other arrangements of spacers 16 may be provided as required.

The placement of the spacers 16 may be similar on each of the substrates 12 within the stack 10 such that they vertically align to provide a continuous support structure through the stack 10.

Some of the spacers 16 may be arranged to provide a masking function to protect the central portions of the substrates from having material deposited thereon during an edge deposition process. Some of the spacers 16 may not be required for the masking function, but are required to provide an evenly distributed support to the substrates 12 within the stack.

Figure 3:
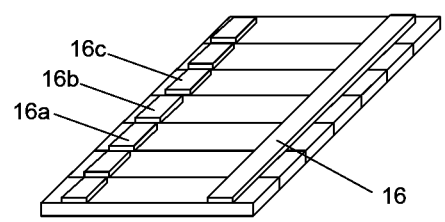
FIG. 3 shows an alternative arrangement of spacers.

As shown in FIG. 3, the spacers 16 may be provided by a single structure which extends across the surface of the substrate and across a plurality of die lines and corresponding dies 26, as shown in the right hand side of FIG. 3. Alternatively, or additionally, spacers 16 may be provided by a distributed array of spacer pads 16 a,b,c, in which each die 12 has one or more individual spacers 16 which are separated from adjacent spacers 16 on the same or adjacent dies 12. The separation of the spacer pads 16 a,b,c may be such that the die lines 28 which define the dies 26 are not crossed by the spacers 16. Providing separate spacers in this way may help simplify the cleaving process as the spacers 16 would not require cleaving.

The die lines shown in the Figures provide a plurality of dies which are elongate with the major sides adjoining adjacent dies. The minor sides or end portions of the dies may provide the exposed edge surfaces of the substrates on to which material may be deposited.

The distributed array of spacers 16 or spacer pads 16a,b,c may be arranged in a linear array in which the spacers 16 and/or spacer pads 16a,b,c are provided in an end to end relation to one another. The spacers 16 and/or spacer pads 16a,b,c may be in line within one another, or staggered along the linear array so as to be offset from the exposed edge 22 by different amounts.

It will be appreciated that the spacers 16 may be any suitable shape to perform the required functions described herein. For example, the spacers 16 may have a polygonal or round footprint. The peripheral walls of the spacers 16 which define the thickness may be perpendicular to the planar surface of the substrate, or may be inclined.

The dimensions of the spacers 16 may be predetermined in accordance with one or more of: the available area in which they can be located; the parasitic effect they will impose on any device performance and the mechanical properties of the material used. For example, providing a larger spacer may be preferable from a protection and robustness point of view, but may increase the stress on the substrate and parasitic capacitance, both of which could have deleterious effects on the device performance.

Figure 4:
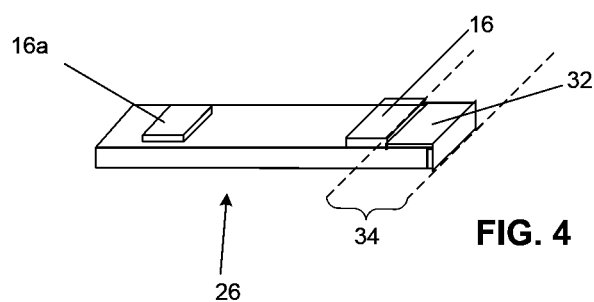
FIG. 4 shows individual dies after disassembly of the stack and cleaving of one of the stack substrates; and, FIG. 5 provides a flow diagram indicating the major method steps for depositing material on the exposed edge regions of a plurality of semiconductor substrates.

FIG. 4 shows the substrate 12 of FIG. 3 after cleaving. Thus, there is shown a single die 26 in which the spacers are located on the surface of the die. The spacer 16 on the right has been cleaved with the substrate 12, the spacer pad 16a on the left was separated from and did not cross the die line 28 and thus did not require cleaving.

Also shown in FIG. 4 is a material 32 which has been deposited on the exposed edge 22. The deposition is shown schematically in FIG. 1 by arrows 30 and can be achieved by any suitable means, such as evaporation. The deposition may be directional and the direction of deposition may be such that one or more of the surfaces along the exposed edge is coated. Thus, post-deposition, the exposed edge and one or more of the facing surface, the opposing back surface, and the outwards facing surface of the wall structure provided by the spacer may have material deposited thereon. The deposited layer may be continuous such that it extends unbroken from one surface to the next.

The material used for deposition on the edges of the stack may be any required. Edge materials could be dielectric materials (either single layers or multiple layer combinations) with thicknesses designed to produce reflective or anti-reflective properties (typically a few 10's to a few 100's of nanometers). Some examples of deposited materials may include: $TiO_2$, $SiO_2$, $Ta_2O_5$, Si, SiON, $Si_3N_4$.

The spacers 16 shown in the drawings are generally elongate structures having a longitudinal axis. The longitudinal axis may be parallel to the exposed edge of the respective die or stack layer such that they are separated by a uniform gap which provides an exposed region, typically a strip, of substrate surface along a length of the substrate 12 in the edge region 34. The size and shape of the exposed region may be predetermined to provide a suitable area for an edge material or coating.

The contact between the abutment surface 22 of the spacer 16 and the adjacent substrate 12 in the stack is sufficient to provide the separation of the adjacent substrates. In addition to this, the spacer 16 may also provide a mask for shielding a central portion of the substrate and/or die. The central portion may be considered to be any portion on the inner side of the spacer 16, such as the footprint area of any devices which are located on a die 26.

The term mask as used herein is not intended to mean that the spacer 16 covers the device or another feature fabricated on the surface of the substrate 12 or die 26. However, it will be appreciated from the description that there may be some coverage of one or more surface features or regions in some cases. That is, there may be a partial or full overlap with one or more device features. The term mask is primarily used to denote a wall structure which is local to the exposed edge in the assembled stack. Thus, the mask may shield the central portion by restricting or preventing line of sight access to the central portion or one or more device features from outside of the stack on the exposed edge side.

One reason for providing a mask in this way is to segregate the edge region 34 for further processing steps. For example, it may be desirable to deposit a material on a portion of the exposed edge region 34 without contaminating the central portion of the die, as described below.

To aid the abutment and masking properties of the spacer 16, the spacer may comprise a compliant material which can deform under compression within the stack.

It will be appreciated that the placement of the spacers 16 may be primarily determined from a masking requirement rather than a spacing requirement. Thus, the contacting surface of the spacers 16 or the distribution of the spacers 16 may be influenced by the masking properties and the areas which require shielding. Further, the thickness of the spacers may be determined by the necessary spacing which is required to allow a suitable material thickness or coverage to be achieved on the exposed edges. That is, if the substrates are too close, there may be shadowing on one or more layers which would lead to an inferior material deposition on the exposed edges.

The substrate/dies may be any known in the art which are used for semiconductor devices. Thus, the substrate/dies may be comprise Silicon, Gallium Arsenide, or Indium Phosphide, for example. The substrate/dies may comprise one or more layers, features or doped areas which are arranged to provide one or more the semiconductor devices as well known in the art. The layers and features may be considered to be part of the substrate/die for the purpose of the description. Additionally, the substrate and dies may be considered to be a substrate for carrying the spacer.

The substrate can be considered to be a planar structure having X and Y dimensions across the surface of the plane, with the Z dimension representing the height as shown. The substrate will typically have a thickness/height of less than 0.5 mm.

The substrates 12 within the stack 10 may be aligned in the Z axis so as to lie directly over one another. Alternatively, the exposed edges may be staggered in the Z axis so as to reveal more of the substrate edge region 34 which requires coating. The stagger may provide the stack with a staircase formation.

Each substrate and/or die may include a plurality of semiconductor devices. The plurality of semiconductor devices may be fabricated in unison on the substrate prior to the substrate being diced to provide the separate semiconductor dies in a conventional manner. The semiconductor dies may then be separately packaged for an end use, as is also well known in the art. The spacers 16 may be added to the substrate before, during or after the devices have been fabricated.

The material used for the spacers 16 may be determined by the specific application and the processing steps that the spacers 16 will have to undergo both during the manufacturing of the device, and post-processing steps in which the spacer provides protection for the central portions of the die. Typically the spacers 16 will be made from the same material and fabricated at the same time. The spacers 16 may be fabricated from a low permittivity material to minimise the effect on the RF behaviour (where applicable), be thermally stable at typical processing temperatures which may be up to 320 degrees centigrade, and provide good adhesion to the host material. A suitable material may be a photoresist. The photoresist may be an epoxy resin. The photoresist may be, for example, SU-8 supplied by Micro-Chem corporation—http://www.microchem.com/Prod-SU8.htm.

The spacers 16 can be fabricated using standard techniques and materials known in the semiconductor manufacturing industries. The point in the fabrication when the spacer 16 is introduced may be application specific but is envisaged that the spacer may remain in place post-processing and may be retained in the device during use. This is particularly so when a material such as SU-8 is used which is typically difficult to remove.

One or more bonding coats may be applied to the substrate prior to the application of the spacer. The bonding coat will be dependent on the spacer and substrate materials, but suitable combinations are generally known in the art.

Figure 5:
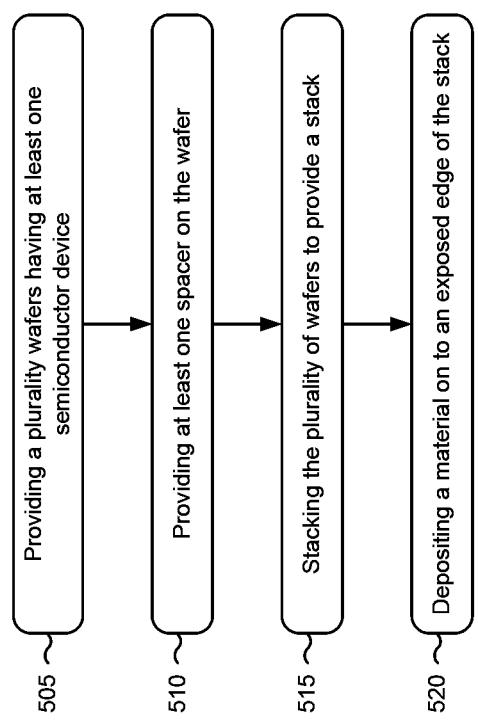

FIG. 5 shows a flow diagram representing the major steps of a fabrication method for a stack of semiconductor substrates. At step 501, a plurality of substrates are provided having at least one semiconductor device. The plurality of substrates may be portions of semiconductor wafer, and the semiconductor devices may be any known in the art. The substrates may have a plurality of intended dies distributed across the surface of thereof. At step 502, spacers are provided on each of the substrates. The spacers may be similar to those described above in relation to FIGS. 1 to 4. The spacers may be provided by a negative tone photoresist which are well known in the art. At step 503, the substrates are stacked together such that adjacent substrates are contacted via the spacers which provide a separating gap between opposing surfaces of the substrates. The stacking may be facilitated with an appropriate mechanism, e.g a jig, into which the substrates can be loaded and/or clamped. At 504, the stack can have one or more materials deposited to the exposed edges of the stack. The deposited material may be any desired and may include, for example, a reflective or anti-reflective coating. The material may be deposited using any known technique, such as evaporation or sputtering. The direction of the deposition is shown as an example in FIG. 1 by arrows 30.

It will be appreciated that the first and second steps, 501 and 502 may be carried out in any order, and the spacers may be provided prior to or as an intermediate step of providing the one or more semiconductor devices.

Subsequent processing steps may include the removal of the substrates from the stack. Cleaving the substrates in to dies in accordance with predetermined die lines. Once separated from the stack and cleaved (where appropriate), the individual substrates/dies may be packaged. The spacers may or may not be removed prior to packaging.

The substrates and devices may be a semiconductor device which comprises: a substrate which contains at least one semiconductor device, wherein an edge region of the substrate includes at least one layer of deposited material, the deposited material bounded by a wall structure in the form of the spacer.

The semiconductor device may be housed within a package to allow it to be used in an electronic device, as is known in the art.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

The invention claimed is:

1. A semiconductor substrate stack, comprising:
   a plurality of semiconductor substrates arranged in a stack in which opposing facing surfaces of adjacent semiconductor substrates, of the plurality of semiconductor substrates, are separated by a gap,
      each semiconductor substrate, of the plurality of semiconductor substrates, having an edge surface at an exposed edge of the stack; and
   a spacer attached to one of the opposing facing surfaces of each of the plurality of semiconductor substrates and extending between the adjacent semiconductor substrates to define the gap and mask a central portion of each respective semiconductor substrate, of the plurality of semiconductor substrates.

2. The semiconductor substrate stack of claim 1, wherein the spacer is separated from the exposed edge.

3. The semiconductor substrate stack of claim 1, wherein the spacer is bonded to the one of the opposing facing surfaces of each of the plurality of semiconductor substrates.

4. The semiconductor substrate stack of claim 1, wherein the spacer is a photoresist.

5. The semiconductor substrate stack of claim 1, wherein the spacer has a thickness greater than 5 microns.

6. The semiconductor substrate stack of claim 1, wherein the spacer has a thickness less than 100 microns.

7. The semiconductor substrate stack of claim 1, wherein the exposed edge and at least one of an upper facing surface and an under opposing surface of each semiconductor substrate include a coating.

8. The semiconductor substrate stack of claim 7, wherein the coating is anti-reflective.

9. A semiconductor substrate stack, comprising:
a first semiconductor substrate that includes a plurality of first dies arranged across a facing surface of the first semiconductor substrate and defined by a die line; and
a second semiconductor substrate that includes a plurality of second dies arranged across a second surface that is opposite the facing surface of the first semiconductor substrate,
wherein each of the plurality first dies comprises at least one semiconductor device and a spacer, and
wherein the spacer extends between the first semiconductor substrate and the second semiconductor substrate to define a gap and mask a central portion of the first semiconductor substrate and the second semiconductor substrate.

10. The semiconductor substrate stack of claim 9, wherein the spacer includes an elongate body having a longitudinal axis.

11. The semiconductor substrate stack of claim 9, wherein the spacer is attached to at least one of the plurality of first dies.

12. The semiconductor substrate stack of claim 9, wherein the spacer extends across more than one of the plurality of first dies.

13. The semiconductor substrate stack of claim 9, wherein the spacer is contained within a boundary of one of the plurality of first dies and does not traverse the die line.

14. The semiconductor substrate stack of claim 9, wherein the spacer is bonded to the semiconductor device.

15. The semiconductor substrate stack of claim 9, wherein the spacer is a photoresist.

16. The semiconductor substrate stack of claim 9, wherein the spacer has a thickness greater than 5 microns.

17. The semiconductor substrate stack of claim 9, wherein the spacer has a thickness less than 100 microns.

18. A semiconductor device substrate comprising:
a substrate comprising at least one semiconductor device, wherein the substrate includes:
a spacer masking a central portion of the substrate and arranged to define a gap between the substrate and an adjacent substrate, and
a surface of the substrate to which the spacer is attached, and
wherein an edge region of the substrate includes at least one layer of deposited material, the deposited material being bounded by the spacer.

19. The semiconductor device substrate of claim 18, further comprising:
a packaging in which the semiconductor device is housed for use.

20. The semiconductor device substrate of claim 19, wherein the edge region includes at least one of an edge or the surface of the substrate.

* * * * *